United States Patent [19]

Jochems

[11] Patent Number: 4,724,221

[45] Date of Patent: * Feb. 9, 1988

[54] HIGH-SPEED, LOW-POWER-DISSIPATION INTEGRATED CIRCUITS

[75] Inventor: Pieter J. W. Jochems, Eindhoven, Netherlands

[73] Assignee: U.S. Philips Corporation, New York, N.Y.

[ * ] Notice: The portion of the term of this patent subsequent to Aug. 21, 2001 has been disclaimed.

[21] Appl. No.: 883,008

[22] Filed: Jul. 7, 1986

Related U.S. Application Data

[60] Division of Ser. No. 823,822, Jan. 28, 1986, abandoned, which is a continuation of Ser. No. 657,036, Oct. 1, 1984, abandoned, which is a continuation of Ser. No. 344,696, Feb. 1, 1982, abandoned.

[30] Foreign Application Priority Data

Oct. 28, 1981 [NL] Netherlands .......................... 8104862

[51] Int. Cl.$^4$ ..................... H01L 21/38; H01L 21/425
[52] U.S. Cl. ........................................ 437/26; 437/32; 437/54; 437/74
[58] Field of Search .................. 29/576 E, 576 B, 578, 29/577 C; 148/175, 187, 190, 191; 357/34

[56] References Cited

U.S. PATENT DOCUMENTS

| | | | |
|---|---|---|---|
| 3,702,428 | 11/1972 | Schmitz et al. .......................... | 357/34 |
| 3,793,088 | 2/1974 | Eckton .............................. | 148/175 X |
| 3,930,909 | 1/1976 | Schmitz et al. .................... | 29/576 E |
| 3,956,035 | 5/1976 | Herrmann ......................... | 29/576 E |
| 4,151,019 | 4/1979 | Tokumaru et al. ................. | 148/175 |
| 4,168,997 | 9/1979 | Compton ........................... | 148/175 |
| 4,247,343 | 1/1981 | Kruzhanoo et al. .................. | 357/42 |
| 4,249,970 | 2/1981 | Briska et al. ........................... | 357/48 |
| 4,325,180 | 4/1982 | Curran .................................. | 357/48 |
| 4,379,726 | 4/1983 | Kumamaru et al. .............. | 29/576 E |
| 4,466,171 | 8/1984 | Jochems ........................... | 148/191 X |
| 4,497,106 | 2/1985 | Momma et al. .............. | 29/576 E X |
| 4,505,766 | 3/1985 | Nagumo et al. .............. | 29/576 E X |

FOREIGN PATENT DOCUMENTS

| | | | |
|---|---|---|---|
| 52-16185 | 2/1977 | Japan ..................................... | 357/48 |
| 53-65675 | 6/1978 | Japan ..................................... | 357/48 |
| 55-52266 | 4/1980 | Japan ..................................... | 357/42 |
| 55-15367 | 11/1980 | Japan ..................................... | 357/42 |
| 55-148465 | 11/1980 | Japan ..................................... | 357/42 |
| 56-94670 | 7/1981 | Japan ..................................... | 357/42 |

OTHER PUBLICATIONS

I. Antipov et al., "Pedestal Base (NPN) and PNP", *IBM Technical Disclosure Bulletin*, vol. 14 (1971) pp. 1645–1646.

J. M. Blum et al., "Formation of Integrated Arrays Having Active Devices and LED's", *IBM Technical Disclosure Bulletin*, vol. 15 (1972) pp. 441–442.

*Primary Examiner*—George T. Ozaki
*Attorney, Agent, or Firm*—Robert T. Mayer; Steven R. Biren

[57] ABSTRACT

A method of manufacturing a semiconductor device having an integrated circuit in an epitaxial layer on a substrate in which the epitaxial layer comprises islands of conductivity type opposite to that of the substrate which are surrounded laterally by a surrounding region of the same conductivity type as the substrate, is disclosed. Both the islands and the surrounding region are formed by diffusion from buried layers through the epitaxial layer. A bipolar transistor is provided in at least one island. The p-n junctions between the islands and the surrounding region are substantially at right angles to the surface. The invention involves a method of manufacturing the device and is of particular importance for realizing very compact and fast circuits with low dissipation consisting of a combination of CMOS bipolar subcircuits.

4 Claims, 12 Drawing Figures

HIGH-SPEED, LOW-POWER-DISSIPATION INTEGRATED CIRCUITS

This is a division of application Ser. No. 823,822, filed Jan. 28, 1986, which was a continuation of application Ser. No. 657,036, filed Oct. 1, 1984, which was a continuation of application Ser. No. 344,696, filed Feb. 1, 1982, now all abandoned.

BACKGROUND OF THE INVENTION

The invention relates to a semiconductor device having an integrated circuit comprising a substrate of a first conductivity type and an epitaxial layer which is present thereon, and which is divided into islands of the second, opposite conductivity type which are surrounded laterally by a surrounding region of the first conductivity type, a bipolar transistor being provided in at least one island.

The invention relates in addition to a method of manufacturing the semiconductor device.

Conventional monolithic integrated circuits show the above-described structure.

In the ever-progressing integration of semiconductor circuits the dimension of the individual semiconductor circuit elements and their mutual distance become smaller and smaller. The packing density to be realized is determined to an ever more important extent by the technology used. In known integrated circuits of the kind mentioned above, for example, the minimum width of the surrounding region between the islands is mainly determined by the lateral diffusion which occurs in the usual isolation diffusions which in the known monolithic integrated circuits form the said surrounding region.

A further limit on the compactness of the structure is imposed by the fact that the buried collector layer generally remains at a certain distance from the isolation diffusion in order to avoid a severe reduction of the breakdown voltage.

In addition to the packing density, the switching speed in highly integrated circuits is of great importance. This speed must generally be as high as possible.

A further important point is the power dissipation. Particularly in circuits comprising memories, low power dissipation with high switching speed is of importance.

These conditions are not realized simultaneously with known technologies in which the islands are formed by homogeneously doped portions of the epitaxial layer which are separated by isolation diffusions.

SUMMARY OF THE INVENTION

One of the objects of the invention is to provide a new semiconductor structure with which circuits of a very compact construction with bipolar transistors of high switching speed can be realized and in which bipolar transistors can be combined without problems with field effect transistors to form fast circuits with very low dissipation.

According to the invention, a semiconductor device of the kind described above is characterized in that the surrounding region and the islands are formed by adjoining regions which are diffused from adjacent buried layers of the first and second conductivity types, respectively, through the epitaxial layer, which buried layers are provided in the vicinity of the interface between the substrate and the epitaxial layer, the p-n junctions between the islands and the surrounding region being substantially at right angles to the surface of the epitaxial layer.

Since the lateral diffusions of the buried layers of opposite conductivity type compensate each other to a considerable extent, so that the out-diffused regions form p-n junctions which mutually are substantially at right angles to the surface, the distance between two islands can be considerably smaller than in the conventional technology. Moreover, the islands show a doping profile which is very favorable for the switching speed of a vertical bipolar transistor provided therein, of which transistor the island forms the collector region. When the bipolar transistor is a lateral transistor, of which transistor the island forms the base region, the doping profile of the island is also favorable since the electric field incorporated thereby is directed so that the emitted charge carriers experience a force directed away from the substrate and are attracted towards of the collector so that the emitter effeciency is favorably influenced.

Of great importance is the case in which in at least one further island an insulated gate field effect transistor is provided. In such a field effect transistor the doping concentration near the surface is decisive of the threshold voltage. By suitable choice of the doping of the buried layer from which the island is formed, and of the diffusion parameters, the doping concentration at the surface in the channel region may be chosen to be as favorable as possible, while, for example, the dopings of the emitter and base zones of vertical bipolar transistors present in other islands can be optimized quite independently of the threshold voltage of the field effect transistor.

According to a very important preferred embodiment, a second insulated gate field effect transistor which is complementary to the first is provided in the surrounding region beside the above-mentioned field effect transistor provided in an island. The complementary (CMOS) field effect transistor combination, for example if constructed as an inverter circuit, has a very low dissipation and can be optimally proportioned by suitable choice of the surface doping of the islands and the surrounding region, independently of the bipolar transistors present. Moreover, this circuit, in combination with a rapid bipolar circuit of which the said bipolar transistor forms part, provides an extremely compact circuit with very favorable electrical properties.

The lateral diffusion of the buried layers below the islands and below the surrounding region is compensated for in a semiconductor body of silicon when the buried layers of one conductivity type are doped with phosphorus and those of the opposite conductivity type are doped with boron, since these two doping elements have substantially the same diffusion coefficient in silicon at the same temperature.

Another important case is the situation in which a vertical bipolar transistor is provided in a phosphorus-doped island and in which in addition a second buried layer is provided to reduce the collector resistance, which second buried layer is doped with a donor which has a lower diffusion coefficient than phosphorus, for example arsenic or antimony, and has a higher doping concentration than the first phosphorus-doped buried layer, which second buried layer adjoins the surrounding region. In this case the first and second buried layers can be implanted through the same mask. The breakdown voltage between the islands and between the islands and the substrate remains sufficiently high since the maximum doping concentration of the buried layer from which the islands and the surrounding region are diffused is comparatively low due to said diffusion.

The invention furthermore relates to a method of manufacturing the semiconductor device which is characterized in that a first dopant determining the second, opposite conductivity type is provided in the surface of a semiconductor substrate of a first conductivity type via a mask having a number of apertures, so as to form island-shaped surface layers of the second conductivity type, that a second dopant determining the first conductivity type is provided in the entire area between said island-shaped surface layers so as to form a surface layer of the first conductivity type having a higher doping concentration than the substrate, that a substantially undoped semiconductor layer is then grown epitaxially on the whole surface, that the surface layers of the first and of the second conductivity type are diffused through the whole thickness of the epitaxial layer, and that a bipolar transistor is formed in at least one of the islands of the second conductivity type thus obtained.

"Substantially undoped" is to be understood to mean in this connection the absence of a purposeful doping so that the doping of the islands and the surrounding region is determined substantially only by the out-diffusion of the buried layers.

BRIEF DESCRIPTION OF THE DRAWING

The invention will now be described in greater detail with reference to a preferred embodiment and the drawing, in which.

Figure 1:
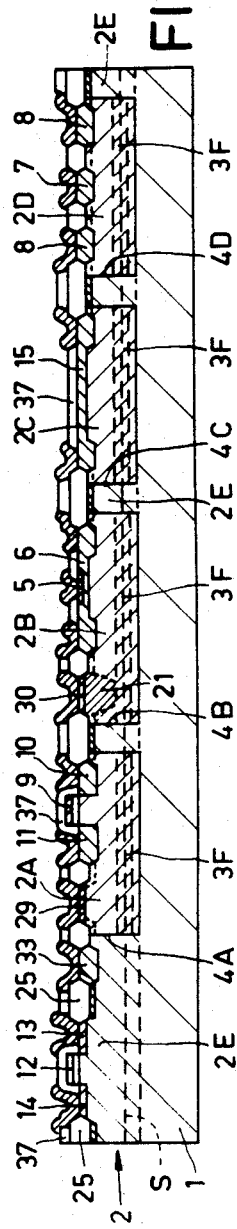
FIG. 1 is a diagrammatic cross-sectional view of part of a device according to the invention.

The Figures are purely diagrammatic and are not drawn to scale. This applies in particular to the dimensions in the direction of thickness. In the cross-sectional views, semiconductor regions of the same conductivity type are shaded in the same direction. Corresponding parts are generally referred to by the same reference numerals in the various Figures. In the plan view of FIG. 2 the boundaries of the metallization are shown in broken lines.

DESCRIPTION OF THE PREFERRED EMBODIMENTS

Figure 2:
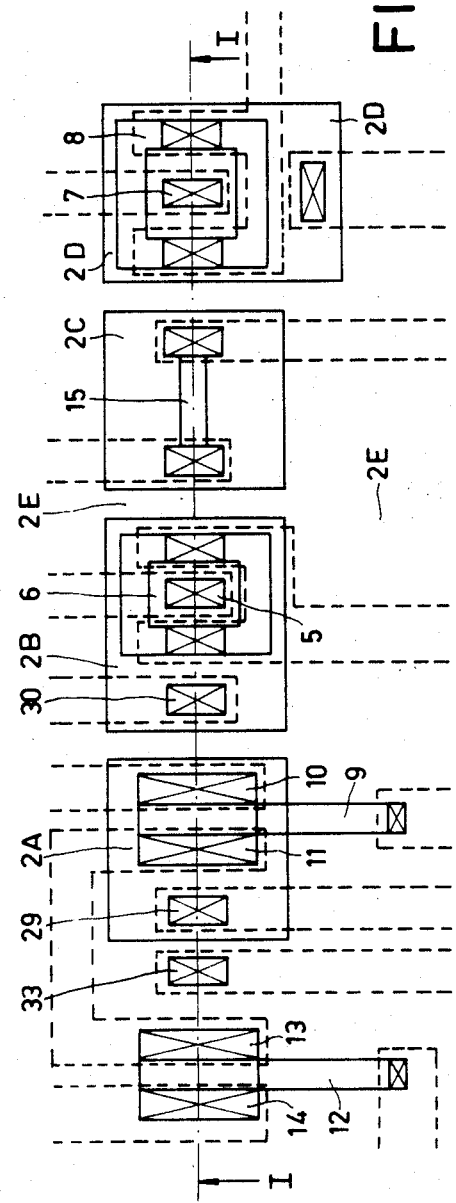
FIG. 2 is a diagrammatic plan view of the device, the cross-sectional view being taken along the line I—I of FIG. 1, and FIGS. 3 to 12 are diagrammatic cross-sectional views of successive stages during the manufacture of the device in accordance with the invention.

FIG. 1 is a diagrammatic cross-sectional view and FIG. 2 is a plan view of a part of a semiconductor device according to the invention. The semiconductor device comprises an integrated circuit having a substrate 1, in this example of silicon, of a first conductivity type, in this case p-type. The resistivity of the substrate in this example is approximately 15 ohm.cm. The orientation of the surface in this case is (100). An epitaxial layer 2 is present on the substrate; the interface between the epitaxial layer 2 and the substrate 1 is shown in broken lines labelled S in the Figure. This epitaxial layer 2 is divided into a number of islands 2A, 2B, 2C and 2D of the second, opposite conductivity type (in this case n-type) which are surrounded laterally by a surrounding region 2E of the first p-conductivity type. A bipolar transistor is provided in at least one island. In the island 2B this is a bipolar vertical n-p-n transistor having an emitter zone 5 and a base zone 6, in the island 2D it is a bipolar lateral p-n-p transistor having an emitter zone 7 and a collector zone 8.

Figure 3:
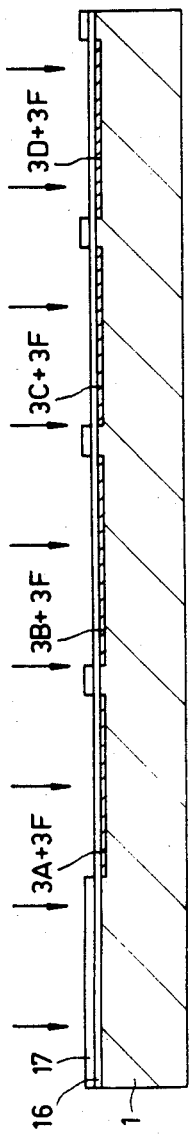
Figure 4:
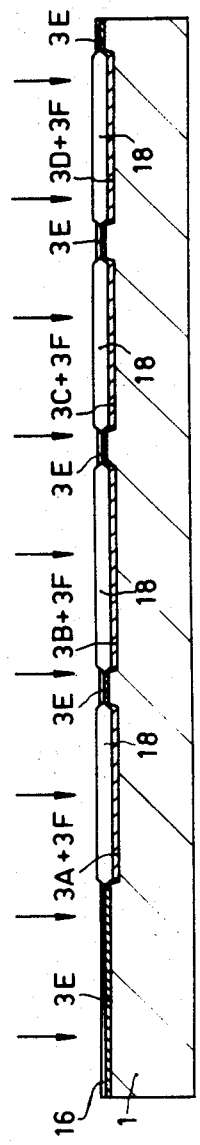
Figure 5:
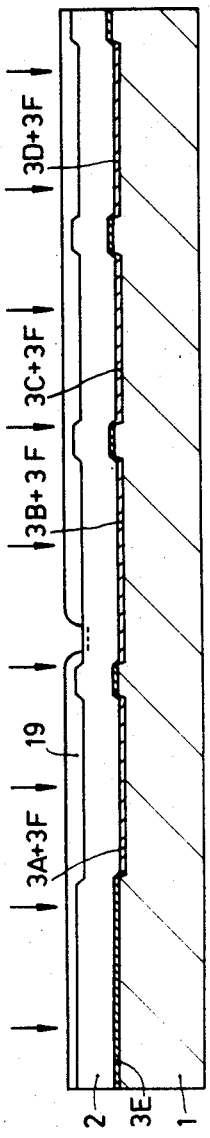
Figure 6:
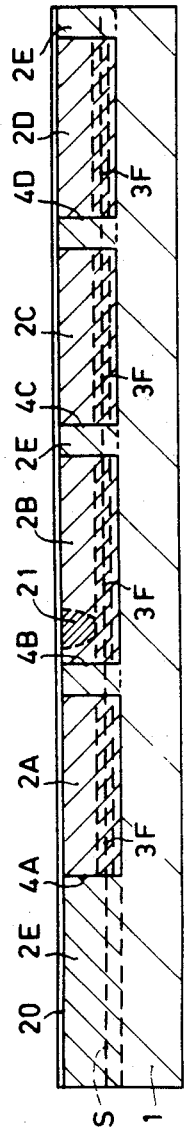
Figure 7:
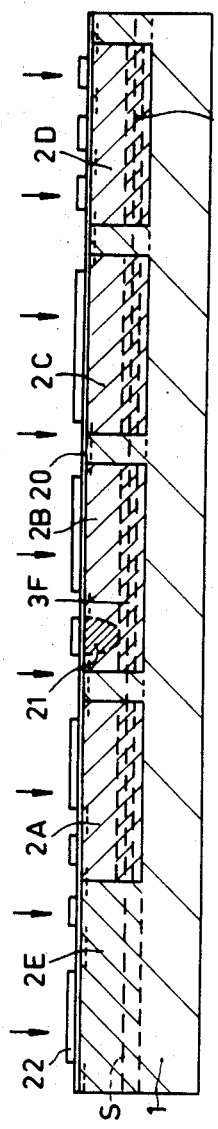
Figure 8:
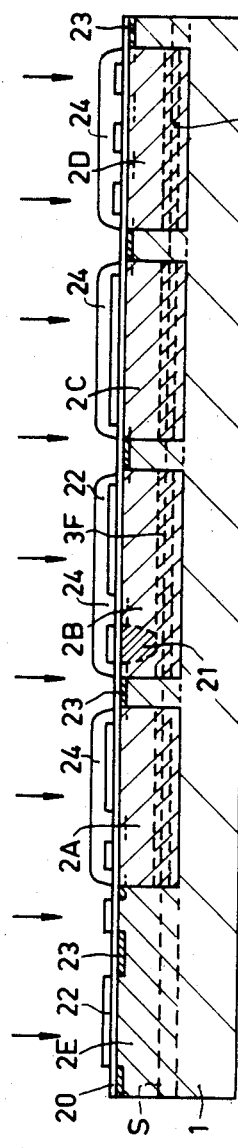

According to the invention both the surrounding region 2E and the islands 2A, B, C and D are formed by adjoining regions diffused from adjacent buried layers (3E of the p-conductivity type, 3A, B, C and D of the n-conductivity type, FIGS. 3 to 5) through the epitaxial layer 2. The said buried layers are provided in the vicinity of the interface between the substrate 1 and the epitaxial layer 2, the p-n junctions 4A, B, C and D between the islands 2A, B, C and D and the surrounding region 2E being substantially normal to the surface of the epitaxial layer 2. The doping concentrations of both the islands 2A, B, C and D and of the surrounding region 2E thereby decrease from the interface between the substrate and the epitaxial layers towards the surface of the epitaxial layer.

The packing density of the structure according to the invention is high due to the fact that the surrounding region 2E between the islands 2A to 2D may be very narrow since the p-n junctions 4A to 4D are substantially at right angles to the surface. This latter is achieved since the lateral diffusion of the n-type dopant of the buried layers 3A to 3D substantially compensates for that of the p-type dopant of the buried layer 3E in forming the regions 2A to 2E by diffusion from the buried layers 3A to 3E through the epitaxial layer 2. In order to achieve this, the buried layers 3A to 3D in this example are doped with phosphorus and the buried layer 3E is doped with boron. These elements have substantially the same diffusion coefficients in silicon at the same temperature.

Furthermore, as a result of the construction of the structure according to the invention, the vertical bipolar n-p-n transistor in the island 2B, of which transistor the island 2B forms the collector zone, has favorable high frequency properties as a result of the doping profile in the collector zone. The increase of the thickness of the base zone as a result of the so-called Kirk effect (see, for example, IEEE Transactions on Electron Devices, ED9, 1962, pp. 164–174) is counteracted by the doping profile of the collector zone.

The doping profile of this island also has a favorable influence on the electrical properties of the lateral p-n-p transistor in the island 2D. In fact this doping profile causes a drift field so that the holes emitted by the emitter experience a force directed away from the substrate so that more holes will be guided in the direction of the collector, in other words, the emitter efficiency is favorably influenced.

A p-channel field effect transistor with insulated gate electrode 9, source zone 10 and drain zone 11 is provided in the island 2A. In addition, an n-channel field effect transistor with insulated gate electrode 12, source zone 13 and drain zone 14 is provided in the surrounding region 2E. Finally, a p-type resistor 15 is provided in the island 2C.

By means of these and other components a circuit arrangement having a very low dissipation (due to the complementary MOST combinations) and a high switching speed (due to the bipolar parts of the circuit) can be constructed.

Further advantages of the invention will become apparent from the description of the manufacture of the device, which description will be given with reference to FIGS. 3 to 12.

The starting material (see FIG. 3) is a p-type silicon substrate 1 having a resistivity of approximately 15 ohm.cm. and a (100) orientation. An approximately 0.05 μm thick oxide layer 16 is provided on the surface of said substrate 1 by oxidation. An oxidation-preventing layer 17, in this example a silicon nitride layer, having a thickness of approximately 0.18 μm, is deposited thereon in the usual manner.

Apertures are then etched in the layer 17 at the area of the islands to be provided, after which phosphorus ions are implanted through the oxide layer 16, in this example with a dose of $4 \times 10^{13}$ ions per cm² and an energy of 170 keV, in the direction of the arrows in FIG. 3. The n-type conductive layers 3A, B, C and D are formed. When an extra buried collector layer is desired for the vertical bipolar transistor to be formed, an arsenic implantation 3F may then be carried out at least at the area of the layer 3B, for example with a dose of $8 \times 10^{14}$ ions per cm² and an energy of 170 keV. An accurate mask is not necessary for this purpose; a photolacquer mask which covers the apertures above the layers 3A, C and D is sufficient. In this example the arsenic implantation 3F is provided in all islands without an extra mask, since the presence thereof is not disturbing in the other islands and in this manner an extra masking step is avoided.

The wafer is then thermally oxidized until an oxide layer 18 having a thickness of 0.4 μm is formed above the layers 3A, B, C and D, see FIG. 4. The nitride layer 17 protects the remaining surface against oxidation.

The silicon nitride layer 17 is then removed by etching and a boron ion implantation is carried out through the oxide layer 16 with a dose of $4 \times 10^{13}$ ions per cm² and an energy of 40 keV to form the p-type layer 3E beyond and between the n-type layers 3A to 3D, in the direction of the arrows in FIG. 4.

All oxide layers are then removed and a substantially undoped silicon layer 2 (less than $10^{15}$ activator atoms per cm³) is deposited epitaxially on the exposed surface, see FIG. 5. Since in this example an n+ connection region 21 (see FIG. 6) is desired wiht the buried collector 3F of the vertical bipolar transistor to be provided, an implantation of arsenic ions (dose $10^{14}$ ions per cm², energy 170 keV) is carried out above the n-type layer 3B using a photolacquer mask 19.

After removing the mask 19, a thin oxide layer 20 of approximately 0.05 μm thickness is grown, after which a heating step at 1200° C. in nitrogen is carried out for approximately 6 hours. The buried layers 3A to 3D diffuse through the whole thickness of the epitaxial layer and thus form the n-type islands 2A to 2D and the surrounding p-type region 2E.

The arsenic implantation in the island 2B diffuses only over a small extent and forms highly doped n-type buried layers 3F in the islands.

Since boron and phosphorus have substantially the same diffusion coefficients in silicon at the same temperature, the lateral diffusions of the buried layers 3A to 3D and 3E substantially neutralize each other. The p-n junctions 4A, B, C and D determined by the net dopings are as a result substantially at right angles to the surface.

A silicon nitride layer 22 is then (see FIG. 7) deposited on the oxide layer 20 in which silicon nitride layer parts are removed by etching at the area of the oxide pattern (25) to be provided subsequently. An arsenic implantation with a dose of $4 \times 10^{11}$ ions per cm² and an energy of 150 keV is then carried out to form n-type channel stoppers in the islands (shown in broken lines). (This arsenic implantation is overdoped by the subsequent boron implantation in those places where it is not masked).

A boron implantation is then (see FIG. 8) carried out with a dose of $5 \times 10^{13}$ ions per cm² and an energy of 25 keV so as to form channel stopper p-type zones 23, the regions which are to be protected against said implantation being covered with a photolacquer layer 24. This photolacquer layer can be obtained with the same mask which was used for etching the nitride layer 17 (see FIG. 3).

After removing the photolacquer mask 24, thermal oxidation is carried out (see FIG. 9) at a temperature of 1100° C. for approximately 1 hour to form a partly countersunk, approximately 0.8 μm thick oxide layer 25, the silicon nitride layer 22 masking against the oxidation. The nitride layer 22 and the oxide layer 20 are then removed and a thin oxide layer 26 is obtained during a short thermal oxidation at 1100° C. This is the so-called "gate-oxide" layer having a thickness of approximately 0.05 μm.

Figure 9:
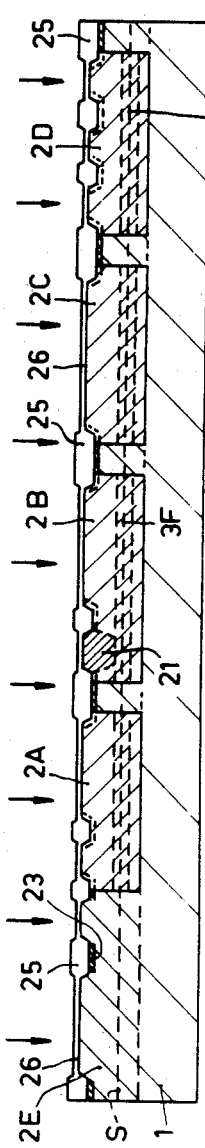
Figure 10:
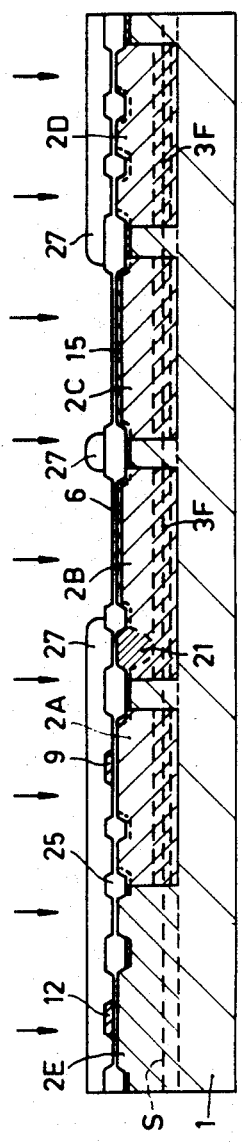
Figure 11:
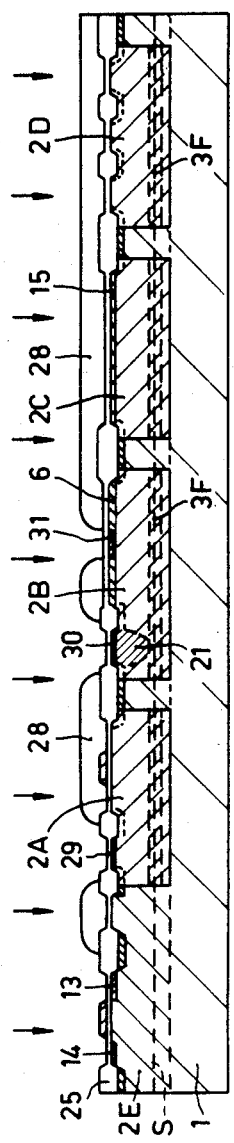
Figure 12:
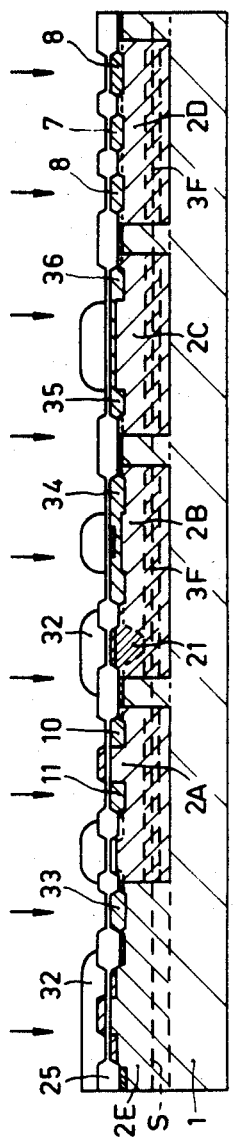

An ion implantation, for example of boron ions, is then carried out, without a mask, in the direction of the arrows in FIG. 9 to determine the threshold voltage of the field effect transistors to be formed. The type of ions, the dose and the implantation energy depend on the desired value of the threshold voltage.

A layer of polycrystalline silicon in then deposited over the whole surface by using conventional techniques. During or after the deposition this layer is doped, for example, by means of a phosphorus diffusion. The silicon layer is then patterned by etching to form a pattern comprising the gate electrodes 9 and 12 (see FIG. 10) and possibly also other electrical interconnection strips.

A boron ion implantation is then carried out to form the base zone 6 of the vertical bipolar transistor and of the resistor 15, see Figrue 10. The remaining parts of the silicon plate are masked by a photolacquer layer 27. This implantation is carried out, for example, with a dose of $2 \times 10^{13}$ ions per cm² and an energy of 60 keV.

Heating at 1000° C. for 30 minutes in nitrogen is then carried out, in which the regions 6 and 15 diffuse slightly deeper and crystal damage as a result of the implantation is recovered, after which (see FIG. 11) a fresh photolacquer mask 28 is provided. An aresenic implantation is then carried out in order to form the source and drain zones 13 and 14 of the n-channel field effect transistor, the contact zone 29 on the island 2A, the collector contact zone 30 and the emitter zone 31 of the vertical bipolar transistor in the island 2B. The gate oxide 26 may or may not be removed prior to said arsenic implantation.

Using a further photolacquer mask 32 (see FIG. 12) a boron ion implantation is carried out to from the contact diffusion 33 on the surrounding region 2E, the source and drain zones 10 and 11 of the p-channel field effect transistor in the island 2A, the base contact zone 34 of the vertical bipolar transistor in the island 2B, the end contact zones 35 and 36 of the resistor 15 in the island 2C and the emitter and collector zones 7 and 8 of the lateral transistor in the island 2D.

After removing the photolacquer mask 32, a layer 37 of pyrolytic silicon oxide is provided over the assembly which is doped with phosphorus succeeded by a gettering step at approximately 1000° C. After this passivation, contact windows are provided in the oxide layer 37 and the metallization is realized, for example, by vapor deposition and etching of aluminum. The structure shown in FIGS. 1 and 2 is eventually obtained in this manner. In FIG. 2 the contact windows have diagonals and the boundaries of the metallization are shown in broken lines.

As will be apparent from this example the construction according to the invention has the important advantage of a very compact structure which is obtained with a technology which moreover makes it possible to optimize the bipolar and the MOS parts of the integrated circuit substantially independently of each other, while in addition the number of accurate alignment steps is very small.

The invention is not restricted to the example described. For example, semiconductor materials other than silicon, for example, III-V compounds such as GaAs, and other insulating layers and masking layers may be used. The conductivity types may all be reversed so that p-type islands surrounded by an n-type region are formed. Furthermore, the manufacturing steps which are not essential for the invention may be omitted or be varied arbitrarily.

What is claimed is:

1. A method of making a semiconductor device of the type having an integrated circuit comprising a substrate of a first conductivity type and an epitaxial layer on said substrate and divided into islands of a second opposite conductivity type which are laterally bounded by a surrounding region of the first conductivity type, and a bipolar transistor in at least one island, the surrounding region and the islands being formed by adjoining regions which are diffused from adjacent buried layers of the first and second conductivity types, respectively, through the epitaxial layer, which buried layers are provided in the vicinity of the interface between the substrate and the epitaxial layer and comprise conductivity-determining impurities having substantially the same diffusion rates, p-n junctions being formed between the islands and the surrounding region which are substantially at right angles to the surface of the epitaxial layer throughout their length due to the diffusion of said impurities at substantially the same rate, said method comprising the steps of providing a first dopant determining the second opposite conductivity type in the surface of said substrate via a mask having a plurality of apertures to form island-shaped surface layers of the second conductivity type, providing a second dopant determining the first conductivity type in the whole region between said island-shaped surface layers to form a surface layer of the first conductivity type having a higher doping concentration than the substrate, then epitaxially growing a substantially undoped semiconductor layer on the whole surface and diffusing the surface layers of the first and of the second conductivity type through the whole thickness of the epitaxial layer, and forming said bipolar transistor in at least one of said islands of the second conductivity type.

2. A method as claimed in claim 1, further comprising the steps of providing another dopant determining the second conductivity type and having a smaller diffusion constant than that of the first dopant in at least one island using said mask, and forming said bipolar transistor as a vertical bipolar transistor in said at least one island having a buried collector layer, the doping of which is determined substantially by said other dopant.

3. A method as claimed in claim 2, characterized in that said other dopant is also provided in all the further islands.

4. A method as claimed in claim 2 or 3, characterized in that the substrate and the epitaxial layer comprise silicon, that the first and the second dopant comprise phosphorus and boron, respectively, and that the other dopant comprises arsenic or antimony.

* * * * *